(12) United States Patent
Lee (10) Patent No.: US 9,305,649 B1
(45) Date of Patent: Apr. 5, 2016

(54) PAGE BUFFER CIRCUIT FOR NAND FLASH MEMORY

(71) Applicant: Winbond Electronics Corp., Taichung (TW)

(72) Inventor: Jong Oh Lee, San Jose, CA (US)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/507,504

(22) Filed: Oct. 6, 2014

(51) Int. Cl.
| | |
|---|---|
| *G11C 16/10* | (2006.01) |
| *G11C 16/08* | (2006.01) |
| *G11C 16/26* | (2006.01) |
| *G11C 16/14* | (2006.01) |
| *G11C 16/12* | (2006.01) |

(52) U.S. Cl.
CPC ............... *G11C 16/08* (2013.01); *G11C 16/10* (2013.01); *G11C 16/12* (2013.01); *G11C 16/14* (2013.01); *G11C 16/26* (2013.01)

(58) Field of Classification Search
CPC ............................. G11C 16/0483; G11C 16/10
USPC ....................................... 365/185.17, 185.24
See application file for complete search history.

(56) References Cited

U.S. PATENT DOCUMENTS

| | | | | | |
|---|---|---|---|---|---|
| 2009/0257277 | A1* | 10/2009 | Kim | ....................... | G11C 7/067 365/185.2 |
| 2013/0208538 | A1* | 8/2013 | Yang | ...................... | G11C 16/28 365/185.2 |
| 2013/0294166 | A1* | 11/2013 | Ha | .......................... | G11C 16/26 365/185.17 |
| 2014/0269065 | A1* | 9/2014 | Jigour | .................... | G11C 29/04 365/185.09 |
| 2014/0347928 | A1* | 11/2014 | Lee | ..................... | G11C 16/0483 365/185.11 |

* cited by examiner

*Primary Examiner* — Michael Tran
(74) *Attorney, Agent, or Firm* — Muncy, Geissler, Olds & Lowe, P.C.

(57) ABSTRACT

A page buffer for a NAND flash memory array includes a pre-charge switch, a first switch, a read switch, a write switch, a latch, and a data switch. The pre-charge switch is coupled between a supply node with a supply voltage and a bit line that is coupled to a selected cell of the NAND flash memory array. The first switch is coupled between the bit line and a data node. The read switch is coupled between the data node and an I/O node. The write switch is coupled between an inverse data node, which is out of phase with the data node, and the I/O node. The latch is coupled between the data node and the inverse data node. The data switch is coupled between the inverse data node and a first node. The enable switch is coupled between the first node and a ground.

14 Claims, 7 Drawing Sheets

PAGE BUFFER CIRCUIT FOR NAND FLASH MEMORY

BACKGROUND OF THE INVENTION

1. Field of the Invention

The disclosure relates generally to a page buffer for a NAND flash memory, and more particularly to a page buffer of a NAND flash memory for reducing the number of transistors.

2. Description of the Related Art

Flash memory devices are generally classified into NOR flash memories and NAND flash memories. In NOR flash memories, the memory cells are connected in parallel to bit lines, resembling the parallel connection of transistors in CMOS NOR gates, and thus are known as NOR flash memory. The memory cells in NOR flash memories can be randomly accessed. Thus NOR flash memories are mainly used in the BIOS of personal computers, or in firmware for ASIC. The memory cells in NAND flash memories, on the other hand, are connected in series resulting a smaller cell size than that of the NOR flash memories. Thus, NAND flash can provide a smaller die size and faster write and read time than NOR flash. However, the memory cells in NAND flash memories cannot be randomly accessed. Therefore, NAND flash memories are mainly used in storage devices, such as hard disks or memory cards.

Each memory cell in a NAND flash memory resembles a standard MOSFET, except that there is a floating gate below the control gate of each memory cell, wherein the floating gate is isolated by an oxide layer. Electrons placed on the floating gate will be trapped for years, modifying the threshold voltage of the cell. A traditional single layer cell (SLC) of a NAND flash memory may have a normal threshold voltage or a modified threshold voltage, and therefore provides two states, i.e., one bit, for the NAND flash memory. Recently, to increase the integration of memory cells of NAND flash memories, multi-level cells (MLC), which provide more than one bit for the NAND flash memory, and therefore exhibit multiple threshold voltages, have been widely utilized in NAND flash memories.

However, in a NAND flash memory, the size of a page buffer does not matter at high density, but it does at low density, such as 64M bit, 128M bit, 256M bit, or 1G bit. In order to lower the chip size of a low-density NAND flash memory, we need a more effective page buffer circuit with fewer transistors to make the chip size smaller.

BRIEF SUMMARY OF THE INVENTION

For solving above problems, the invention provides a page buffer circuit with a reduced number of transistors for a NAND flash memory.

In an embodiment, a page buffer for a NAND flash memory array comprises a pre-charge switch, a first switch, a read switch, a write switch, a latch, a data switch, and an enable switch. The pre-charge switch is coupled between a supply node and a bit line and is controlled by a pre-charge signal. The bit line is coupled to a selected cell of the NAND flash memory array, and the supply voltage is applied to the supply node. The first switch is coupled between the bit line and a data node and is controlled by a program signal. The read switch is coupled between the data node and an I/O node and is controlled by a read signal. The write switch is coupled between an inverse data node and the I/O node and is controlled by a write signal. The data node and the inverse data node are out of phase. The latch is coupled between the data node and the inverse data node. The data switch is coupled between the inverse data node and a first node and is controlled by the bit line. The enable switch is coupled between the first node and a ground and is controlled by an enable signal.

In an embodiment of the page buffer, the page buffer operates in a read operation which comprises the following steps: (1) setting the data node to a low logic level and the inverse data node to a high logic level; (2) pre-charging the bit line by the pre-charge switch controlled by the pre-charge signal; and (3) sensing data of the selected cell to obtain the data of the selected cell through the I/O node.

In an embodiment of the page buffer, the step of sensing the data of the selected cell to obtain the data of the selected cell through the I/O node comprises the following steps: (1) sensing the data of the selected cell by the bit line, wherein the bit line is discharged when the selected cell is an erase cell, and the bit line is kept at the supply voltage when the selected cell is a program cell; (2) providing a pulse to the enable switch by the enable signal; and (3) sensing data of the bit line by the inverse data node, wherein the inverse data node is discharged when the selected cell is a program cell, and the inverse data node is kept at the supply voltage when the selected cell is an erase cell.

In an embodiment of the page buffer, the page buffer operates in a write operation which comprises the following steps: (1) setting the data node to a high logic level and the inverse data node to a low logic level; (2) issuing program data to the inverse data node through the write switch; (3) setting the data node to inverse program data by the latch, wherein the program data and the inverse program data are out of phase; (4) transferring the inverse program data from the data node to the bit line by the first switch; and (5) programming the selected cell by the inverse program data of the bit line.

In an embodiment of the page buffer, the selected cell is programmed to be an erase cell when the program data is the low logic level, and the selected cell is programmed to be a program cell when the program data is the high logic level.

In an embodiment of the page buffer, the first switch is a transmission gate which comprises a P-type transistor and an N-type transistor. The P-type transistor is coupled between the bit line and the data node and is controlled by an inverse program signal. The inverse program signal and the program signal are out of phase. The N-type transistor is coupled between the bit line and the data node and is controlled by the program signal.

In an embodiment of the page buffer, the latch comprises a first inverter and a second inverter. The first inverter comprises a first P-type transistor, which is coupled between a first power node and the inverse data node and is controlled by the data node, and a first N-type transistor, which is coupled between the inverse data node and a first reference node and is controlled by the data node. The second inverter comprises a second P-type transistor, which is coupled between a second power node and the data node and is controlled by the inverse data node, and a second N-type transistor, which is coupled between the data node and a second reference node and is controlled by the inverse data node.

In an embodiment of the page buffer, the page buffer operates in a read operation which comprises the following steps: (1) setting the data node to a low logic level and the inverse data node to a high logic level; (2) pre-charging the bit line by the pre-charge switch controlled by the pre-charge signal; and (3) sensing data of the selected cell to obtain the data of the selected cell through the I/O node.

In an embodiment of the page buffer, the step of setting the data node to the ground and the inverse data node to the supply voltage comprises the following steps: (1) transferring reset data from the I/O node to the data node through the read switch turned on by the read signal, wherein the reset data is at the low logic level; (2) biasing both the first power node and the first reference node to the supply voltage and both the second power node and the second reference node to the ground; (3) setting the inverse data node to the high logic level through the first inverter; (4) biasing both the first and second power nodes to the supply voltage and both the first and second reference nodes to the ground; and (5) turning off the read switch.

In an embodiment of the page buffer, the step of sensing the data of the selected cell to obtain the data of the selected cell through the I/O node comprises the following steps: (1) sensing the data of the selected cell by the bit line, wherein the bit line is discharged when the selected cell is an erase cell, and the bit line is kept at the supply voltage when the selected cell is a program cell; (2) providing a pulse to the enable switch by the enable signal; and (3) sensing data of the bit line by the inverse data node, wherein the inverse data node is discharged when the selected cell is a program cell, and the inverse data node is kept at the supply voltage when the selected cell is an erase cell.

In an embodiment of the page buffer, the page buffer operates in a write operation which comprises the following steps: (1) setting the data node to a high logic level and the inverse data node to a low logic level; (2) issuing program data to the inverse data node through the write switch; (3) setting the data node to inverse program data by the latch, wherein the program data and the inverse program data are out of phase; (4) transferring the inverse program data from the data node to the bit line by the first switch; and (5) programming the selected cell by the inverse program data of the bit line.

In an embodiment of the page buffer, the step of setting the data node to the high logic level and the inverse data node to the low logic level comprises the following steps: (1) transferring set data from the I/O node to the inverse data node through the write switch turned on by the write signal, wherein the set data is the low logic level; (2) biasing both the second power node and the second reference node to the supply voltage and both the first power node and the first reference node to the ground; (3) setting the data node to the high logic level through the second inverter; (4) biasing both the first power node and second power node to the supply voltage and both the first reference node and second reference node to the ground; and (5) turning off the write switch.

In an embodiment of the page buffer, the step of setting the data node to inverse program data by the latch comprises the following steps: (1) biasing both the second power node and the second reference node to the supply voltage and both the first power node and the first reference node to the ground; (2) setting the data node to the inverse program data by the second inverter and the program data; and (3) biasing both the first power node and the second power node to the supply voltage and both the first reference node and second reference node to the ground.

In an embodiment of the page buffer, the selected cell is programmed to be an erase cell when the program data is at the low logic level, and the selected cell is programmed to be a program cell when the program data is at the high logic level.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
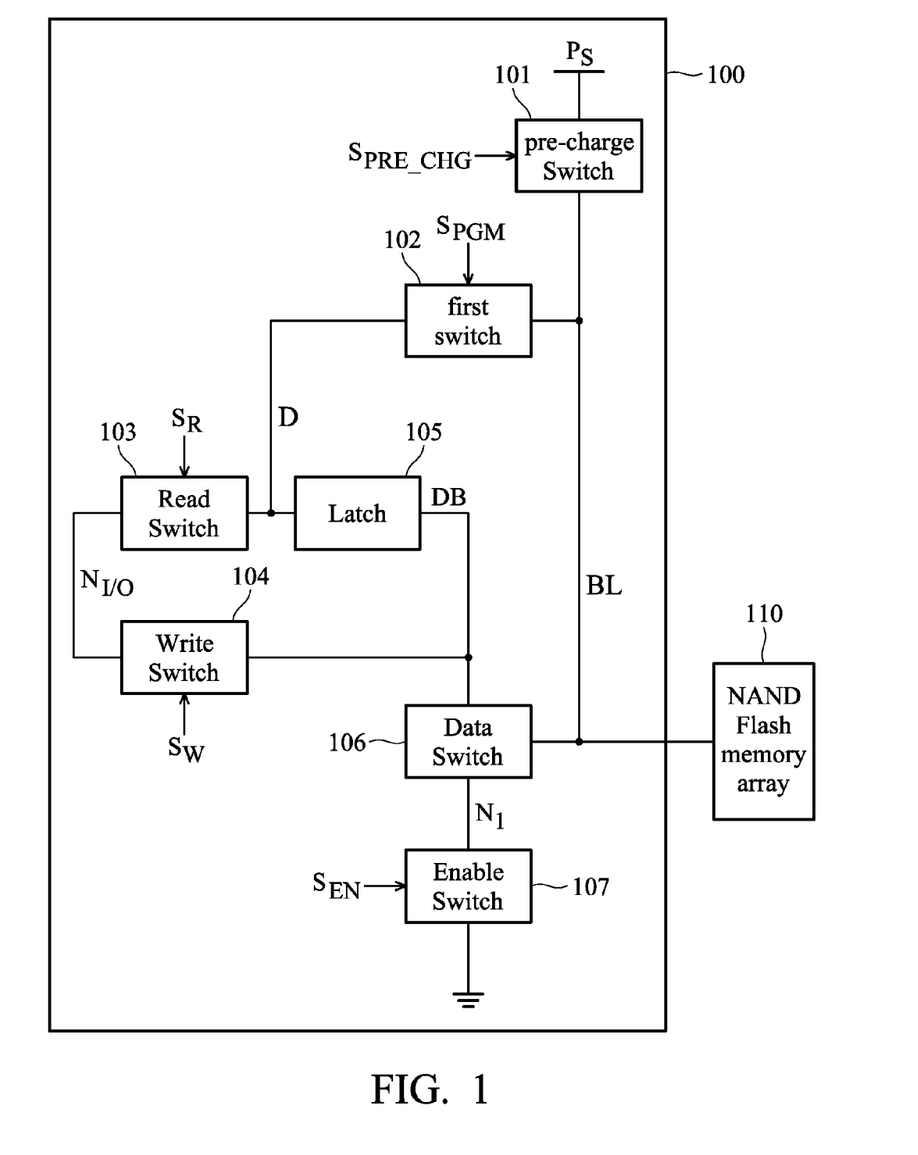
FIG. 1 is a block diagram of a page buffer circuit in accordance with an embodiment of the invention.

FIG. 1 is a block diagram of a page buffer circuit in accordance with an embodiment of the invention. As shown in FIG. 1, the page buffer circuit 100 includes the pre-charge switch 101, the first switch 102, the read switch 103, the write switch 104, the latch 105, the data switch 106, and the enable switch 107. The pre-charge switch 101 is coupled between the supply node $P_S$ and the bit line BL. The supply voltage $V_S$ is applied to the supply node $P_S$.

The pre-charge switch 101 is controlled by the pre-charge signal $S_{PRE\_CHG}$ to pre-charge the bit line BL to the high logic level. According to an embodiment of the invention, the bit line BL is pre-charged to the supply voltage $V_S$. The bit line BL is also coupled to the NAND flash memory array 110. According to an embodiment of the invention, when a cell of the NAND flash memory array 110 is selected (not shown in FIG. 1), the bit line BL is coupled to the selected cell.

The first switch 102 is controlled by the program signal $S_{PGM}$ to transfer the data of the data node D to the bit line BL. The read switch 103 is controlled by the read signal $S_R$ to send the data of the data node D to the I/O node $N_{I/O}$. The write switch 104 is controlled by the write signal $S_W$ to transfer the data of the inverse data node DB to the I/O node $N_{I/O}$. The data of the data node D is out of phase with that of the inverse data node DB. According to an embodiment of the invention, when the data of the data node D is at the high logic level, the data of the inverse data node DB is at the low logic level, and vice versa.

The latch 105 is coupled between the data node D and the inverse data node DB, which is used to keep the data of the data node D and that of the inverse data node DB out of phase with each other. The data switch 106 is controlled by the bit line BL to couple the inverse data node DB to the first node $N_1$. The enable switch 107 is controlled by the enable signal $S_{EN}$ to couple the first node $N_1$ to the ground.

Figure 2:
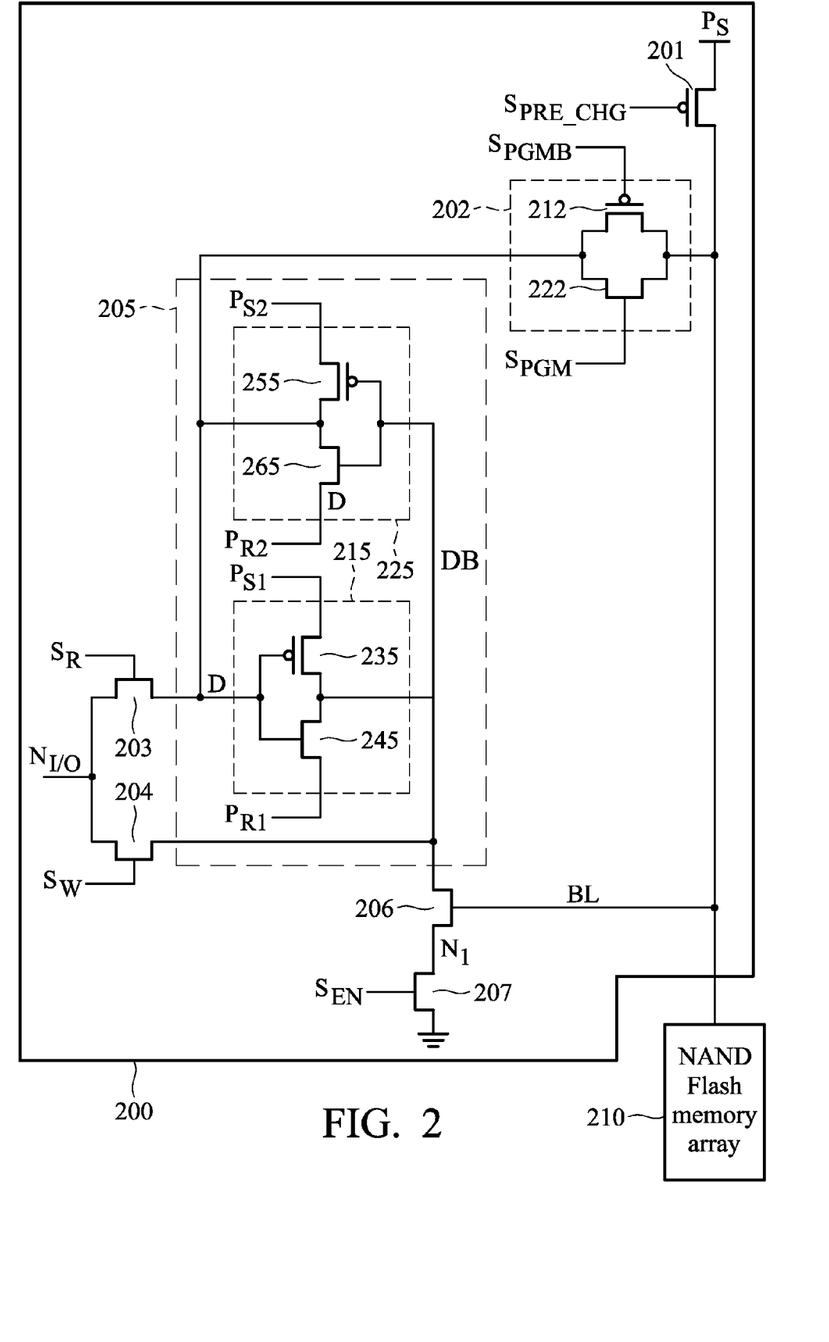
FIG. 2 is a schematic diagram of the page buffer circuit of FIG. 1 in accordance with the preferred embodiment of the invention.

FIG. 2 is a schematic diagram of the page buffer circuit of FIG. 1 in accordance with an embodiment of the invention. As shown in FIG. 2, the pre-charge switch 101 is replaced by a pre-charge P-type transistor 201 which is controlled by the pre-charge signal $S_{PRE\_CHG}$. The first switch 102 is replaced by the transmission gate 202. The transmission gate 202 includes the P-type transistor 212 controlled by the inverse program signal $S_{PGMB}$ and the N-type transistor 222 controlled by the program signal $S_{PGM}$. The inverse program signal $S_{PGMB}$ is out of phase with the program signal $S_{PGM}$, such that the inverse program signal $S_{PGMB}$ could be considered as being generated by the program signal $S_{PGM}$ through an inverter.

The latch 105 is replaced by the latch 205 in FIG. 2. The latch 205 includes the first inverter 215 coupled to the first power node $P_{S1}$ and the first reference node $P_{R1}$ and the second inverter 225 coupled to the second power node $P_{S2}$ and the second reference node $P_{R2}$. The first inverter 215 includes the first P-type transistor 235 and the first N-type transistor 245.

The first P-type transistor 235 is coupled between the first power node $P_{S1}$ and the inverse data node DB and is controlled by the data node D. The first N-type transistor 245 is coupled between the inverse data node DB and the first reference node $P_{S1}$ and is controlled by the data node D. The second P-type transistor 255 is coupled between the second power node $P_{S2}$ and the data node D and is controlled by the inverse data node DB. The second N-type transistor 265 is coupled between the data node D and the second reference node $P_{R2}$ and is controlled by the inverse data node DB.

Since the first inverter 215 and the second inverter 225 are connected back-to-back, it makes the data of the data node D and that of the inverse data node DB out of phase with each other. That is, the data node D is at the high logic level when the inverse data node DB is at the low logic level, and vice versa. According to an embodiment of the invention, the first reference node $P_{S1}$, the first reference node $P_{R1}$, the second power node $P_{S2}$ and the second reference node $P_{R2}$ are varied between the supply voltage $V_S$ and the ground.

In addition, the read switch 103 and the write switch 104 are replaced by the read N-type transistor 203 and the write N-type transistor 204, respectively. The data switch 106 of FIG. 1 is replaced by the data N-type transistor 206. The enable switch 107 is replaced by the enable N-type transistor 207.

Figure 3:
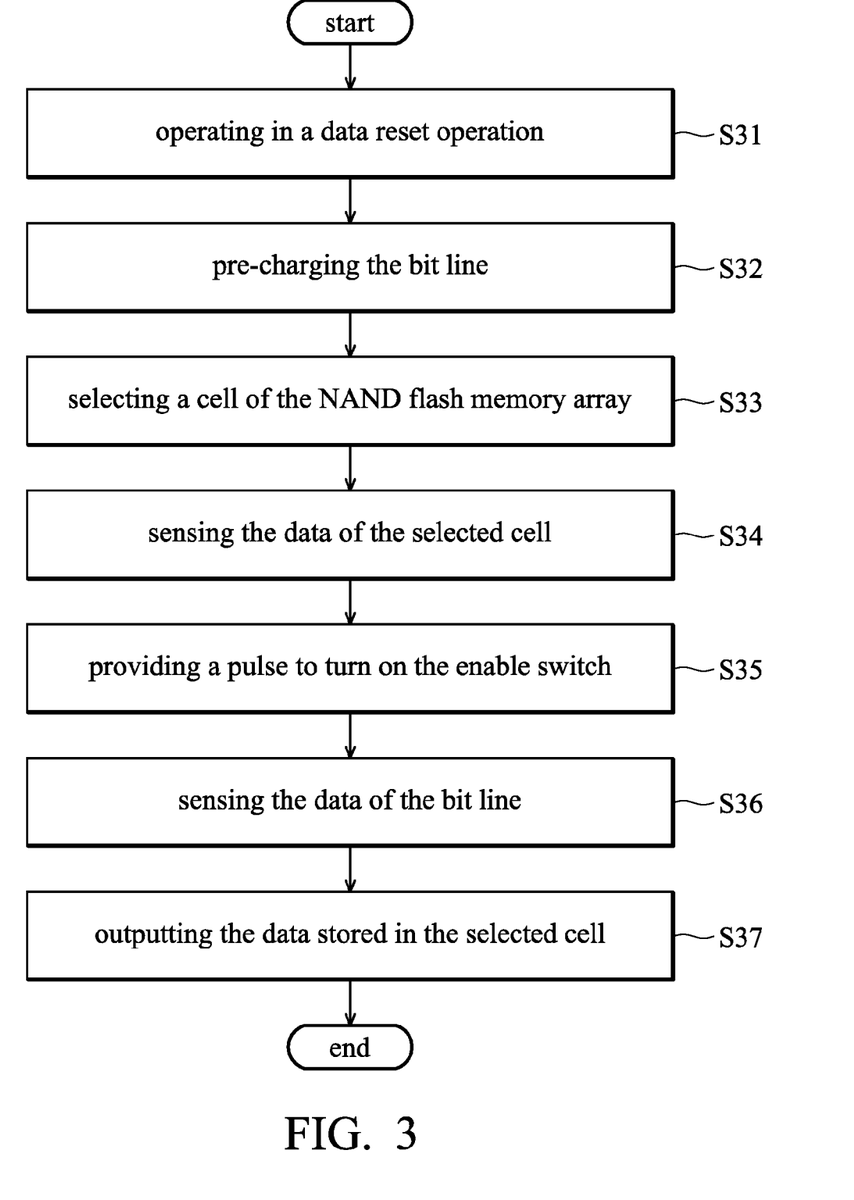
FIG. 3 is flow chart of the page buffer circuit operating in a read operation in accordance with an embodiment of the invention.

FIG. 3 is flow chart of the page buffer circuit operating in a read operation in accordance with an embodiment of the invention. In order to clearly explain the invention, the read operation in the following description will be explained with the schematic in FIG. 2.

As shown in FIG. 3, the page buffer circuit 200 is operated in a data reset operation, such that the data node D is set to the low logic level (e.g. the ground), and the inverse data DB is thus set to the high logic level (e.g. the supply voltage $V_S$) by the latch 205 (Step S31). The data reset operation will be explained in the following description. Then, the bit line BL is pre-charged by the pre-charge P-type transistor 201 (Step S32).

The pre-charge P-type transistor 201 is controlled by the pre-charge signal $S_{PRE\_CHG}$. When the bit line BL is pre-charged by the pre-charge P-type transistor 201, the pre-charge signal $S_{PRE\_CHG}$ is in the low logic level (e.g. the ground) to activate the pre-charge P-type transistor 201 to charge the bit line BL to the high logic level (e.g. the supply voltage $V_S$) since the supply voltage $V_S$ is applied to the supply node $P_S$.

After the bit line is charged to the supply voltage $V_S$, a cell of the NAND flash memory array 210 is selected (Step S33). The data of the selected cell is sensed by the bit line (Step S34). According to an embodiment of the invention, the bit line BL is discharged when the selected cell is an erase cell, and the bit line BL is kept at the supply voltage $V_S$ when the selected cell is a program cell.

Then, a pulse is provided by the enable signal $S_{EN}$ to turn on the enable switch 207 (Step S35). The data of the bit line BL is sensed by the inverse data node DB (Step S36). Since a pulse is provided to activate the enable switch 207, the inverse data node DB is discharged through the data switch 206 and the enable switch 207 when the bit line BL is in the high logic level, and the inverse data node DB is kept at the high logic level (e.g. the supply voltage $V_S$) when the bit line BL is at the low logic level (e.g. the ground). In sum, the inverse data node DB is discharged when the selected cell is a program cell, and the inverse data node DB is kept at the supply voltage $V_S$ when the selected cell is an erase cell. Finally, the data stored in the selected cell is outputted at the I/O node $N_{I/O}$ through the read N-type transistor 203 (Step S37).

Figure 4:
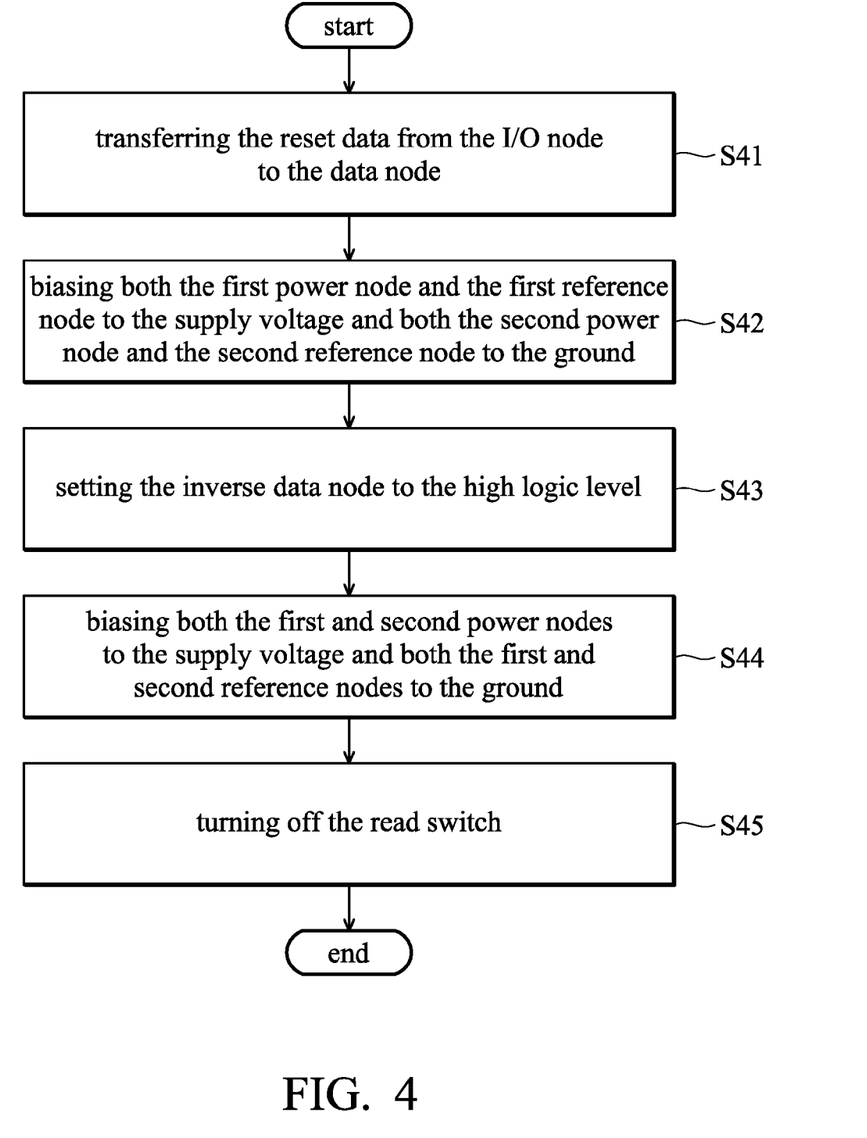
FIG. 4 is a flow chart of the page buffer circuit operating in a data reset operation in accordance with an embodiment of the invention.

FIG. 4 is a flow chart of the page buffer circuit operating in a data reset operation in accordance with an embodiment of the invention. A reset data in the low logic level is transferred from the I/O node $N_{I/O}$ to the data node D through the read N-type transistor 203 since the read N-type transistor 203 is turned on by the read signal $S_R$ (Step S41).

The first power node $P_{S1}$ and the first reference node $P_{R1}$ are biased to the supply voltage $V_S$, and the second power node $P_{S2}$ and the second reference node $P_{R2}$ are biased to the ground (Step S42), such that the first inverter 215 is ON and the second inverter 225 is OFF. The inverse data node DB is thus pulled to the high logic level by the first P-type transistor 235 of the first inverter 215 (Step S43). Then, the first and second power nodes $P_{S1}$ and $P_{S2}$ are biased to the supply voltage $V_S$, and the first and second reference nodes $P_{R1}$ and $P_{R2}$ are biased to the ground (Step S44). Finally, the read transistor 203 is turned off by the read signal $R_S$.

Figure 5:
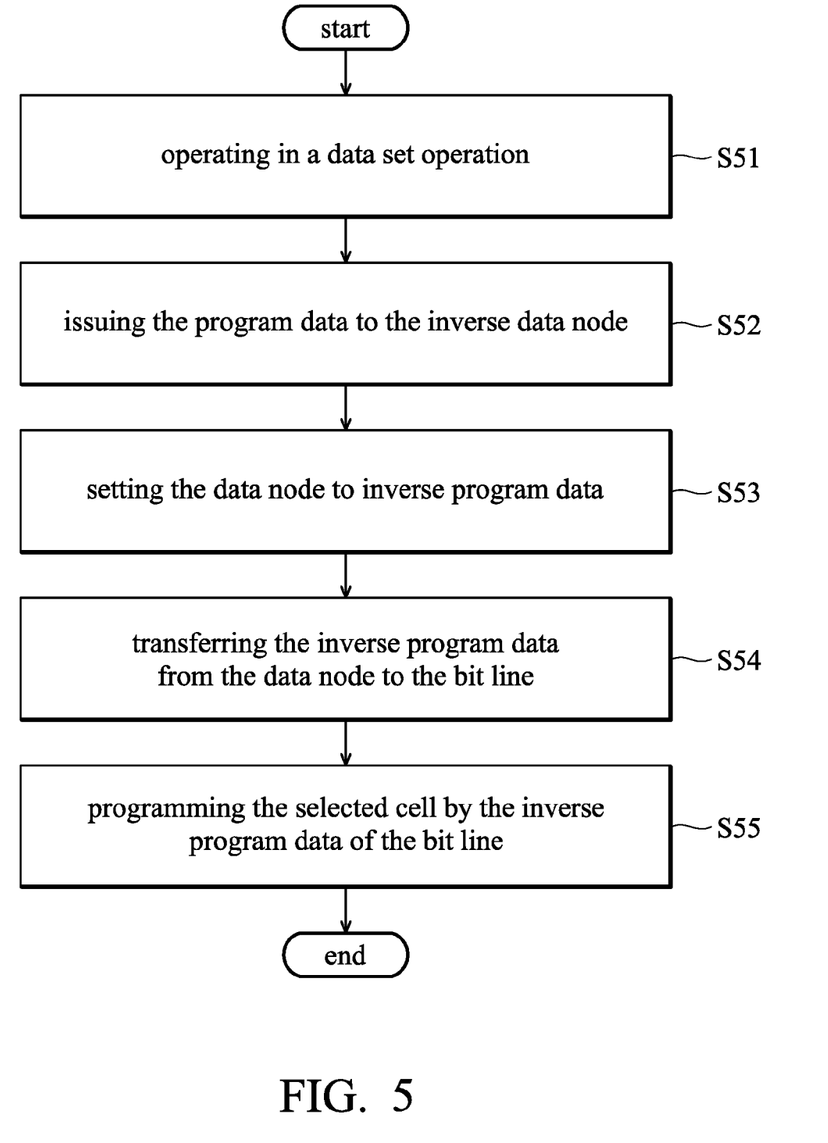
FIG. 5 is a flow chart of the page buffer circuit operating in a write operation in accordance with an embodiment of the invention.

FIG. 5 is a flow chart of the page buffer circuit operating in a write operation in accordance with an embodiment of the invention. The page buffer is operated in a data set operation, such that the data node D is set to the high logic level (e.g. the supply voltage $V_S$) and the inverse data node is set to the low logic level (e.g. the ground) (Step S51). The data set operation will be explained in the following description. The program data is issued from the I/O node $N_{I/O}$ to the inverse data node DB (Step S52). Since the write N-type transistor 204 is turned on by the write signal $S_W$, the program data is passed to the inverse data node DB from the I/O node $N_{I/O}$.

The data node D is set to the inverse program data by the latch 205 (Step S53), and the inverse program data is out of phase with the program data. That is, the inverse program data is at the high logic level when the program data is at the low logic level, and vice versa. The inverse program data is transferred from the data node D to the bit line BL by the transmission gate 202 (Step S54), in which the transmission gate 202 is turned on by the inverse program signal $S_{PGMB}$ and the program signal $S_{PGM}$.

Finally, the selected cell of the NAND flash memory array 210 is programmed by the inverse program data of the bit line BL (Step S55). According to an embodiment of the invention, the selected cell is programmed to be an erase cell when the program data is at the low logic level, and the selected cell is programmed to be a program cell when the program data is at the high logic level.

Figure 6:
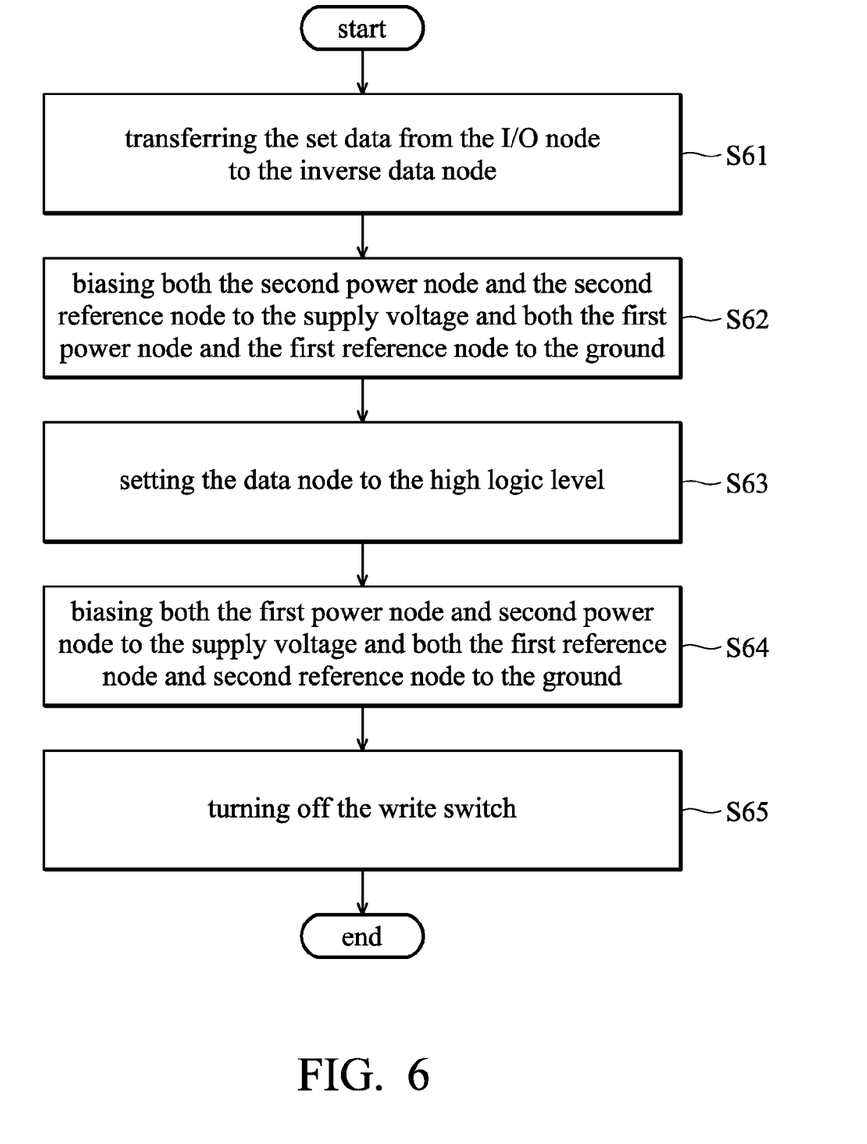
FIG. 6 is a flow chart of the page buffer circuit operating in a data set operation in accordance with an embodiment of the invention.

FIG. 6 is a flow chart of the page buffer circuit operating in a data set operation in accordance with an embodiment of the invention. The set data is transferred from the I/O node $N_{I/O}$ to the inverse data node DB (Step S61) since the write N-type transistor 204 is turned on by the write signal $S_W$, and the set data is in the low logic level. The second power node $P_{S2}$ and the second reference node $P_{R2}$ are biased to the supply voltage $V_S$, and the first power node $P_{S1}$ and the first reference node $P_{R1}$ are biased to the ground (Step S62). The data node D is thus pulled to the high logic level (e.g. the supply voltage $V_S$) by the second P-type transistor 255 of the second inverter 225 (Step S63).

The first and second power nodes $P_{S1}$ and $P_{S2}$ are biased to the supply voltage $V_S$, and the first and second reference nodes $P_{R1}$ and $P_{R2}$ are biased to the ground (Step S64), such that the latch 205 is back to normal operation. Finally, the write switch is turned off (Step S65).

Figure 7:
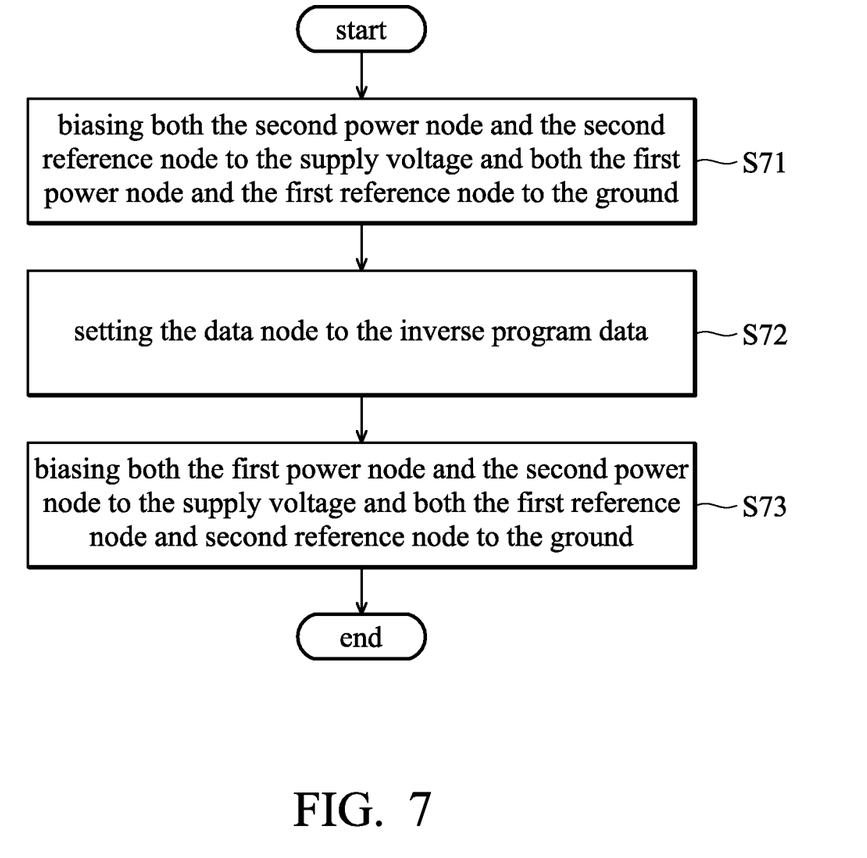
FIG. 7 is a flow chart of Step S53 in FIG. 5 in accordance with an embodiment of the invention.

FIG. 7 is a flow chart of Step S53 in FIG. 5 in accordance with an embodiment of the invention. The second power node $P_{S2}$ and the second reference node $P_{R2}$ are biased to the supply voltage $V_S$, and the first power node $P_{S1}$ and the first reference node $P_{R1}$ are biased to the ground (Step S71). The data node D is set to the inverse program data by the second P-type transistor 255 of the second inverter 225 (Step S72), and the inverse program data is out of phase with the program data. The first and second power nodes $P_{S1}$ and $P_{S2}$ are biased to the supply voltage $V_S$, and the first and second reference nodes $P_{R1}$ and $P_{R2}$ are biased to the ground (Step S73), such that the latch 205 is back to normal operation.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A page buffer for a NAND flash memory array, comprising:
   a pre-charge switch, coupled between a supply node and a bit line and controlled by a pre-charge signal, wherein the bit line is coupled to a selected cell of the NAND flash memory array, and the supply voltage is applied to the supply node;
   a first switch, coupled between the bit line and a data node and controlled by a program signal;
   a read switch, coupled between the data node and an I/O node and controlled by a read signal;
   a write switch, coupled between an inverse data node and the I/O node and controlled by a write signal, wherein the data node and the inverse data node are out of phase;
   a latch, coupled between the data node and the inverse data node;
   a data switch, coupled between the inverse data node and a first node and controlled by the bit line; and
   an enable switch, coupled between the first node and a ground and controlled by an enable signal.

2. The page buffer of claim 1, wherein the page buffer operates in a read operation comprising the following steps:
   setting the data node to a low logic level and the inverse data node to a high logic level;
   pre-charging the bit line by the pre-charge switch controlled by the pre-charge signal; and
   sensing data of the selected cell to obtain the data of the selected cell through the I/O node.

3. The page buffer of claim 2, wherein the step of sensing the data of the selected cell to obtain the data of the selected cell through the I/O node comprises the following steps:
   sensing the data of the selected cell by the bit line, wherein the bit line is discharged when the selected cell is an erase cell, and the bit line is kept at the supply voltage when the selected cell is a program cell;
   providing a pulse to the enable switch by the enable signal; and
   sensing data of the bit line by the inverse data node, wherein the inverse data node is discharged when the selected cell is a program cell, and the inverse data node is kept at the supply voltage when the selected cell is an erase cell.

4. The page buffer of claim 1, wherein the page buffer operates in a write operation comprising the following steps:
   setting the data node to a high logic level and the inverse data node to a low logic level;
   issuing program data to the inverse data node through the write switch;
   setting the data node to inverse program data by the latch, wherein the program data and the inverse program data are out of phase;
   transferring the inverse program data from the data node to the bit line by the first switch; and
   programming the selected cell by the inverse program data of the bit line.

5. The page buffer of claim 4, wherein the selected cell is programmed to be an erase cell when the program data is the low logic level, and the selected cell is programmed to be a program cell when the program data is the high logic level.

6. The page buffer of claim 1, wherein the first switch is a transmission gate, wherein the transmission gate comprises:
   a P-type transistor, coupled between the bit line and the data node and controlled by an inverse program signal, wherein the inverse program signal and the program signal are out of phase; and
   an N-type transistor, coupled between the bit line and the data node and controlled by the program signal.

7. The page buffer of claim 1, wherein the latch comprises:
   a first inverter, comprising:
      a first P-type transistor, coupled between a first power node and the inverse data node and controlled by the data node; and
      a first N-type transistor, coupled between the inverse data node and a first reference node and controlled by the data node; and
   a second inverter comprising:
      a second P-type transistor, coupled between a second power node and the data node and controlled by the inverse data node; and
      a second N-type transistor, coupled between the data node and a second reference node and controlled by the inverse data node.

8. The page buffer of claim 7, wherein the page buffer operates in a read operation comprising the following steps:
   setting the data node to a low logic level and the inverse data node to a high logic level;
   pre-charging the bit line by the pre-charge switch controlled by the pre-charge signal; and
   sensing data of the selected cell to obtain the data of the selected cell through the I/O node.

9. The page buffer of claim 8, wherein the step of setting the data node to the ground and the inverse data node to the supply voltage comprises the following steps:
   transferring reset data from the I/O node to the data node through the read switch turned on by the read signal, wherein the reset data is at the low logic level;
   biasing both the first power node and the first reference node to the supply voltage and both the second power node and the second reference node to the ground;
   setting the inverse data node to the high logic level through the first inverter;

biasing both the first and second power nodes to the supply voltage and both the first and second reference nodes to the ground; and turning off the read switch.

10. The page buffer of claim 8, wherein the step of sensing the data of the selected cell to obtain the data of the selected cell through the I/O node comprises the following steps:

sensing the data of the selected cell by the bit line, wherein the bit line is discharged when the selected cell is an erase cell, and the bit line is kept at the supply voltage when the selected cell is a program cell;

providing a pulse to the enable switch by the enable signal; and sensing data of the bit line by the inverse data node, wherein the inverse data node is discharged when the selected cell is a program cell, and the inverse data node is kept at the supply voltage when the selected cell is an erase cell.

11. The page buffer of claim 7, wherein the page buffer operates in a write operation comprising the following steps:

setting the data node to a high logic level and the inverse data node to a low logic level;

issuing program data to the inverse data node through the write switch;

setting the data node to inverse program data by the latch, wherein the program data and the inverse program data are out of phase;

transferring the inverse program data from the data node to the bit line by the first switch; and programming the selected cell by the inverse program data of the bit line.

12. The page buffer of claim 11, wherein the step of setting the data node to the high logic level and the inverse data node to the low logic level comprises the following steps:

transferring set data from the I/O node to the inverse data node through the write switch turned on by the write signal, wherein the set data is at the low logic level;

biasing both the second power node and the second reference node to the supply voltage and both the first power node and the first reference node to the ground;

setting the data node to the high logic level through the second inverter;

biasing both the first power node and second power node to the supply voltage and both the first reference node and second reference node to the ground; and turning off the write switch.

13. The page buffer of claim 11, wherein the step of setting the data node to inverse program data by the latch comprises the following steps:

biasing both the second power node and the second reference node to the supply voltage and both the first power node and the first reference node to the ground;

setting the data node to the inverse program data by the second inverter and the program data; and biasing both the first power node and the second power node to the supply voltage and both the first reference node and second reference node to the ground.

14. The page buffer of claim 11, wherein the selected cell is programmed to be an erase cell when the program data is at the low logic level, and the selected cell is programmed to be a program cell when the program data is at the high logic level.

* * * * *